(12) United States Patent
Mizuyoshi

(10) Patent No.: US 6,995,400 B2
(45) Date of Patent: Feb. 7, 2006

(54) LIGHT EMITTING DEVICE AND MANUFACTURING METHOD THEREOF

(75) Inventor: Akira Mizuyoshi, Aasaka (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 116 days.

(21) Appl. No.: 10/670,740

(22) Filed: Sep. 26, 2003

(65) Prior Publication Data

US 2004/0061120 A1   Apr. 1, 2004

(30) Foreign Application Priority Data

Sep. 30, 2002   (JP) ............................. 2002/287296

(51) Int. Cl.
*H01L 27/15*   (2006.01)

(52) U.S. Cl. ................ 257/79; 257/200; 257/201; 257/81

(58) Field of Classification Search .................. 257/79
See application file for complete search history.

(56) References Cited

U.S. PATENT DOCUMENTS 6,661,167 B2 * 12/2003 Eliashevich et al. ........ 313/512
6,747,298 B2 *  6/2004 Slater et al. ................ 257/200

FOREIGN PATENT DOCUMENTS

JP        6-244458 A      9/1994

* cited by examiner

*Primary Examiner*—Thao P. Le
(74) *Attorney, Agent, or Firm*—Sughrue Mion, PLLC

(57) ABSTRACT

In a light emitting device, a light emitting element which includes a transparent substrate and a stack of GaN-based compound semiconductor layers formed on the first surface of the transparent substrate is mounted on a lead frame or a printed circuit board so that the transparent substrate is located on the side of the stack of GaN-based compound semiconductor layers opposite to the lead frame or the printed circuit board. The second surface of the transparent substrate opposite to the first surface contains a portion inclined with respect to the first surface. Alternatively, an optical member is arranged in contact with the second surface of the transparent substrate, where a surface of the optical member located on the opposite side to the transparent substrate contains a portion inclined with respect to the first surface of the transparent substrate.

17 Claims, 15 Drawing Sheets

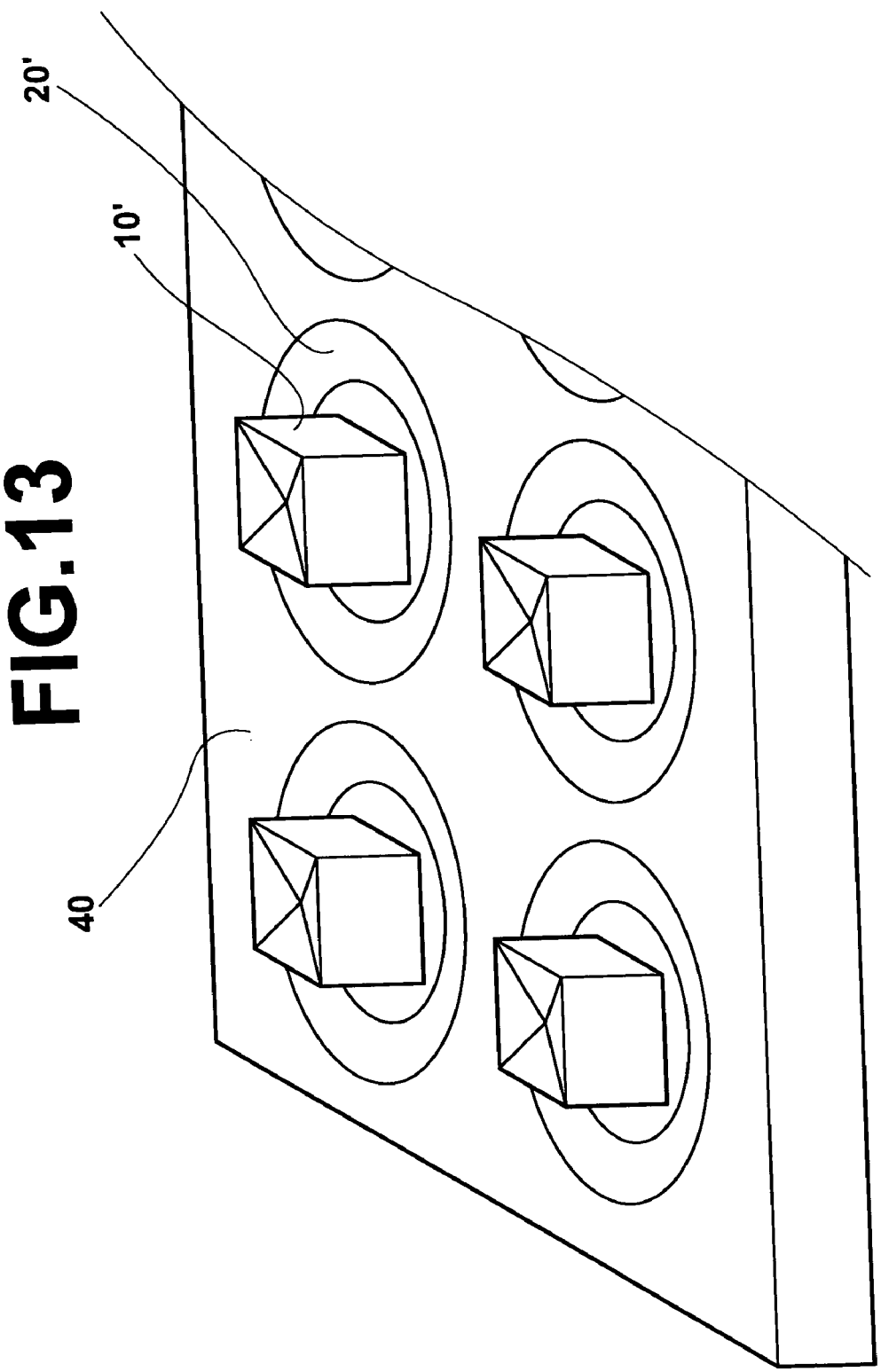

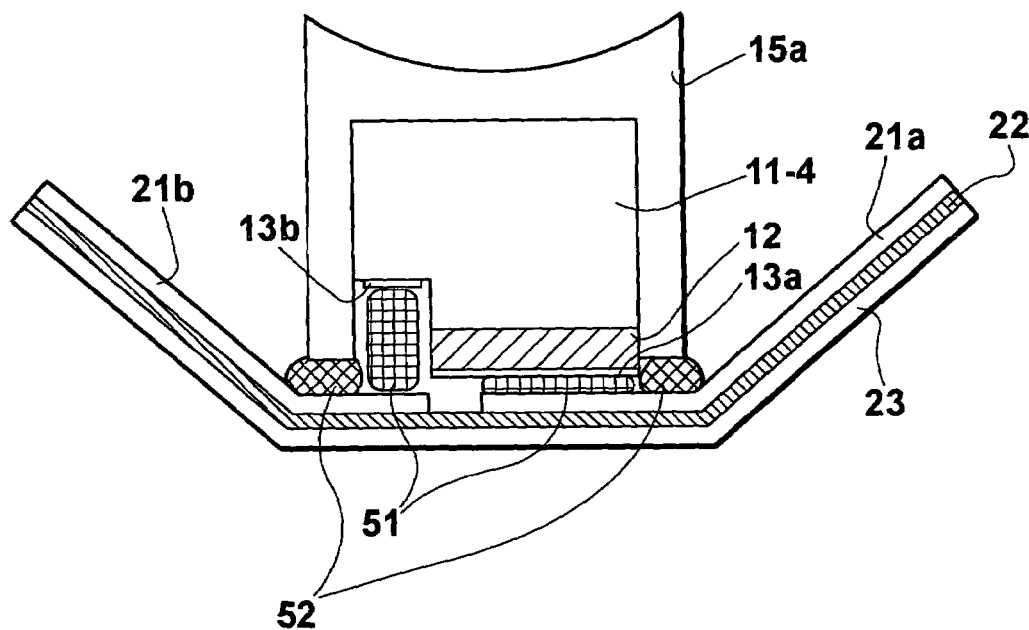
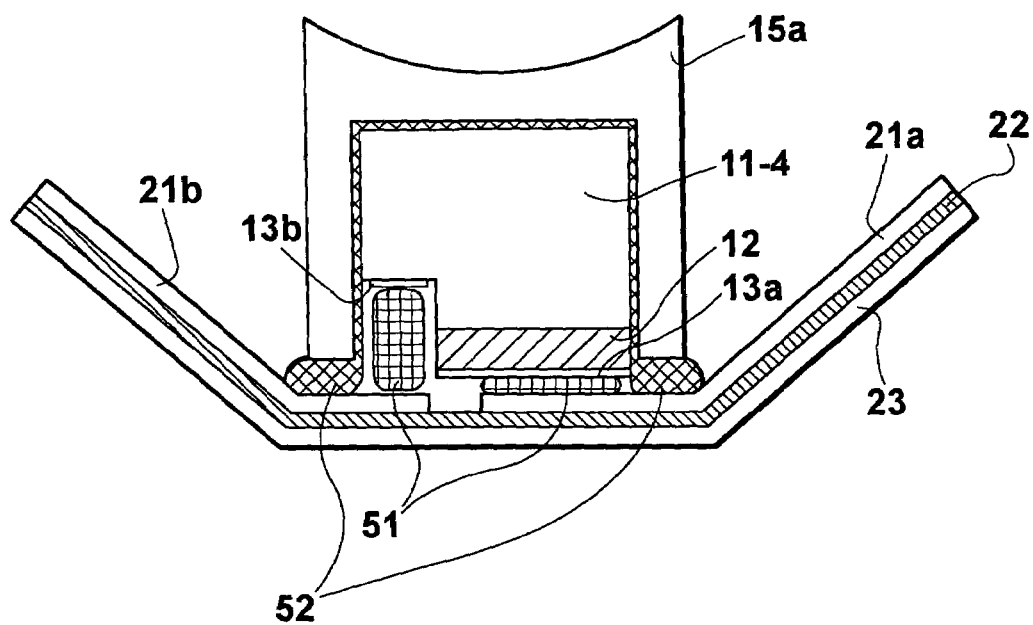

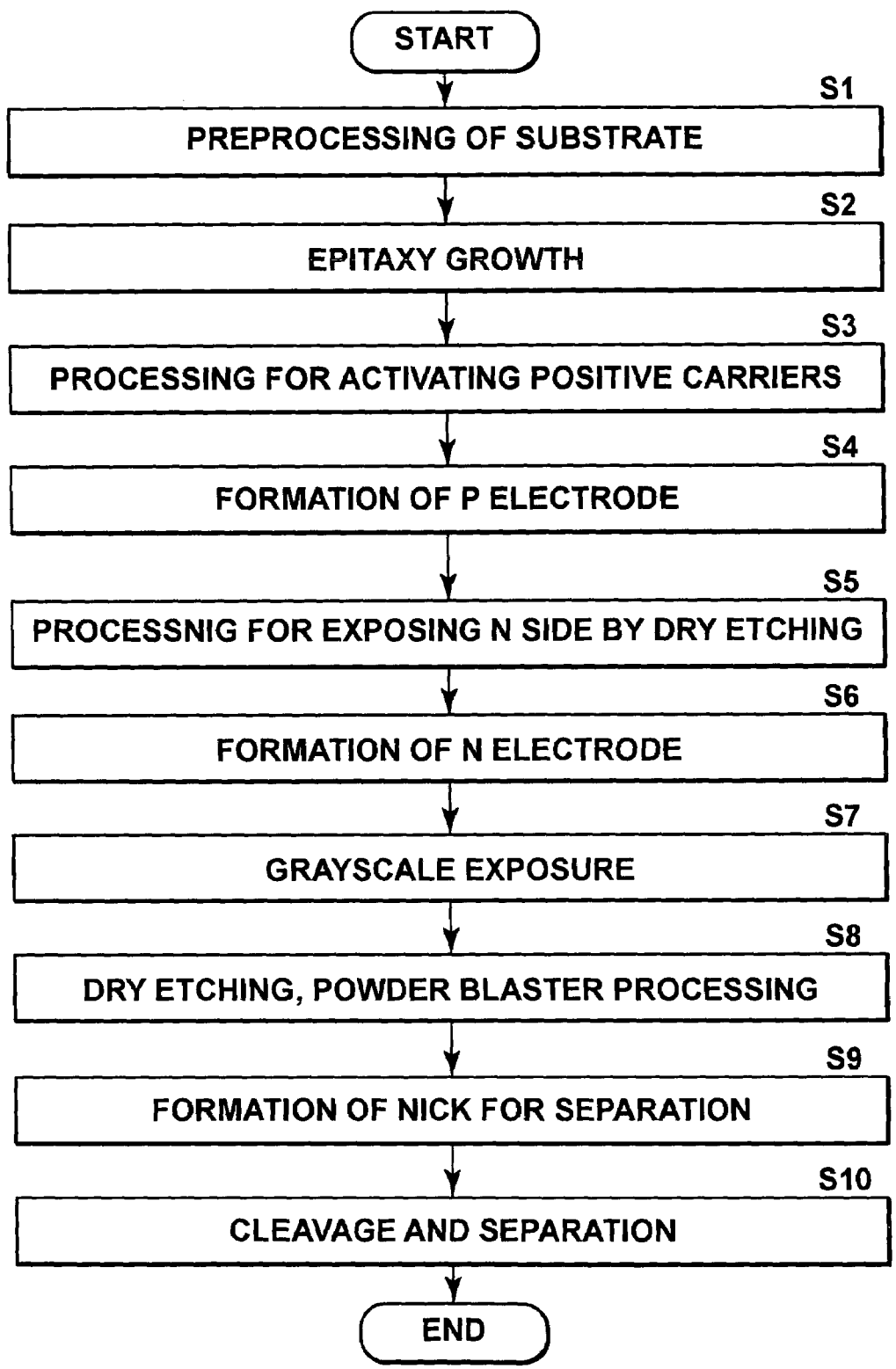

LIGHT EMITTING DEVICE AND MANUFACTURING METHOD THEREOF

BACKGROUND OF THE INVENTION

1. Field of the Invention

The present invention relates to a light emitting device containing a light emitting element and a process for producing such a light emitting device, where the light emitting element is constituted by a transparent substrate and a stack of GaN-based compound semiconductor layers formed on the transparent substrate.

2. Description of the Related Art

Conventionally, light emitting devices for light irradiation are used in various apparatuses (e.g., optical reading apparatuses such as facsimile apparatuses and image scanners, and fixing devices in color thermal printers). Various light emitting devices which use light emitting diodes (LEDs) as light sources have been proposed. The LEDs are small in size and relatively stable.

For example, in the fixing devices in color thermal printers, ultraviolet light is applied to thermal color-forming layers in color thermal recording sheets in order to fix recording images thermally recorded in the color thermal recording sheets. However, the emission efficiencies (optical output/current) of the conventional LEDs having emission wavelengths suitable for fixing thermal color-forming layers for yellow and magenta are low, and energy conversion efficiencies (optical output/input power) are also low. Therefore, the intensities of illumination are too small.

In order to obtain sufficient intensity of illumination, increase in packaging density of LEDs is considered. However, when the packaging density is high, it is difficult to sufficiently dissipate heat generated by the LEDs. Therefore, the element temperature rises, and the emission efficiency drops. Thus, the challenge is to increase the utilization efficiency of light emitted from each LED.

Incidentally, in some LEDs, a light emitting element constituted by a transparent substrate and a stack of GaN-based compound semiconductor layers formed on the transparent substrate is mounted on a lead frame or a printed circuit board so that the transparent substrate is located on the opposite side to the lead frame or printed circuit. In such LEDs, light emitted from a light-emission surface of the stack of GaN-based compound semiconductor layers and is incident on a light-exit surface (upper surface) of the transparent substrate at an angle greater than a critical angle is totally reflected at the light-exit surface, and directed to a side surface of the transparent substrate. When the light totally reflected at the light-exit surface is incident on the side surface of the transparent substrate at an angle greater than the critical angle, the light is totally reflected at the side surface of the transparent substrate, and returned to the light-exit surface. The light returned to the light-exit surface is absorbed by the light-exit surface, and is therefore not effectively used. Thus, the utilization efficiency of the emitted light decreases.

In order to solve the above problem, Japanese Unexamined Patent Publication No. 6(1994)-244458 discloses an LED in which a side surface of the light emitting element is cut at a bevel from the upper surface of the transparent substrate so that the side surface makes an acute angle with the upper surface, and light reflected at the light-exit surface is incident on the side surface at an angle not greater than the critical angle. In this case, a greater amount of light can go out of the light emitting device and utilized, i.e., the utilization efficiency of emission light can be increased.

However, in the above LED having a side surface beveled at the acute angle, the upper surface area of the transparent substrate is greater than the light-emission surface area of the light emission region, and the upper portion of the LED overhangs in horizontal directions. Therefore, downsizing of the LED in the horizontal directions is difficult. In particular, when a plurality of LEDs are arranged in an array on a circuit board or the like, it is difficult to conserve space.

SUMMARY OF THE INVENTION

An object of the present invention is to provide a light emitting device which can enhance the utilization efficiency of light emitted from a light emitting element, and reduce the size in horizontal directions thereof.

(1) According to the first aspect of the present invention, there is provided a light emitting device comprising: a light emitting element which includes a transparent substrate and a stack of GaN-based compound semiconductor layers formed on a first surface of the transparent substrate; and a lead frame or a printed circuit board on which the light emitting element is mounted so that the transparent substrate is located on the side of the stack of GaN-based compound semiconductor layers opposite to the lead frame or the printed circuit board; wherein a second surface of the transparent substrate opposite to the first surface contains a portion inclined with respect to the first surface.

According to the second aspect of the present invention, there is provided a light emitting device comprising: a light emitting element which includes a transparent substrate and a stack of GaN-based compound semiconductor layers formed on a first surface of the transparent substrate; an optical member which is arranged in contact with a second surface of the transparent substrate opposite to the first surface, and has a surface (as a light-exit surface) being located on an opposite side to the transparent substrate and containing a portion inclined with respect to the first surface of the transparent substrate; and a lead frame or a printed circuit board on which the light emitting element is mounted so that the transparent substrate is located on a side of the stack of GaN-based compound semiconductor layers opposite to the lead frame or the printed circuit board.

The above portion of the second surface of the transparent substrate in the first aspect of the present invention and the above-mentioned surface of the optical member in the second aspect of the present invention are inclined, based on the theoretical consideration explained later, so as to enable efficient output of light emitted from the upper surface of the stack of GaN-based compound semiconductor layers (the boundary between the transparent substrate and the stack of GaN-based compound semiconductor layers), which is called a light-emission surface. Inclinations caused by production errors are not included in the scope of the present invention.

The transparent substrates may be made of, for example, sapphire or SiC.

The GaN-based compound semiconductor layers may be made of, for example, GaN, InGaN, GaAlN, InAlGaN, and the like.

While the upper surface (i.e., the second surface) of the transparent substrate contains a portion inclined with respect to the upper surface of the stack of GaN-based compound semiconductor layers (i.e., the first surface of the transparent substrate) in the light emitting device according to the first aspect of the present invention, the optical member which has a light-exit surface containing a portion inclined as mentioned above is arranged in contact with the upper surface (i.e., the second surface) of the transparent substrate in the light emitting device according to the second aspect of the present invention, instead of providing a transparent substrate which has an upper surface containing a portion inclined as mentioned above. That is, a construction equivalent to the light emitting device according to the first aspect of the present invention can be realized by providing the above optical element separately from an existing light emitting element and putting the optical element in contact with the existing light emitting element.

The optical element may be made of, for example, optical glass, resin, or the like. A typical example of the resin is plastic. It is preferable that the refractive index of the optical element approximates the refractive index of the transparent substrate.

It is possible that the optical element has a function of a sealing package, which is an element for (hermetically) sealing the light emitting element and protecting the light emitting element from the external environment.

In each of the light emitting devices according to the first and second aspects of the present invention, the inclined portion may contain one or more conical surfaces, one or more pyramidal surfaces, one or more hemispherical surfaces, one or more paraboloidal surfaces, or any combination thereof.

(2) According to the third aspect of the present invention, there is provided a process for producing a light emitting device, comprising the steps of: (a) applying a resist to a first surface of a transparent substrate located opposite to a stack of GaN-based compound semiconductor layers, where the stack of GaN-based compound semiconductor layers is formed on a second surface of the transparent substrate opposite to the first surface, and the stack of GaN-based compound semiconductor layers and the transparent substrate constitute a light emitting element; (b) shaping the first surface of the transparent substrate by grayscale exposure and dry etching so that the first surface of the transparent substrate contains a portion inclined with respect to the second surface of the transparent substrate (i.e., the upper surface of the stack of GaN-based compound semiconductor layers); and (c) mounting the light emitting element on one of a lead frame and a printed circuit board so that the transparent substrate is located on a side of the stack of GaN-based compound semiconductor layers opposite to the one of the lead frame and the printed circuit board.

In the grayscale exposure, a negative (filter) in which a desired shape having at least one recession and/or at least one protrusion is represented by grayscale information is placed on an applied resist, and laser light or the like is applied to the resist through the negative so that the resist receives amounts of exposure corresponding to the grayscale information. Thereafter, the exposed resist is developed so as to remove portions of the resist according to the amounts of exposure.

The dry etching is etching in which no liquid is used. For example, the dry etching includes reactive ion etching, reactive ion-beam etching, sandblaster processing, powder blaster processing, and the like.

Thus, the step (b) in the process according to the third aspect of the present invention is realized by the substeps of: (b1) applying a resist on the first surface (upper surface) of the transparent substrate; (b2) shaping the resist by grayscale exposure so that the upper surface of the exposed resist has a desired shape containing a portion inclined with respect to the second surface of the transparent substrate; and (b3) performing dry etching of the resist shaped in the substep (b2) and the transparent substrate under the shaped resist, so that the first surface of the transparent substrate finally has the same shape as the upper surface of the exposed resist (i.e., the upper surface of the transparent substrate finally has the desired shape containing a portion inclined with respect to the second surface of the transparent substrate).

In addition, the above process according to the third aspect of the present invention can be modified for use in shaping the light-exit surface of the optical element in the second aspect of the present invention so that the light-exit surface of the optical element contains the portion inclined with respect to the second surface of the transparent substrate (i.e., the upper surface of the stack of GaN-based compound semiconductor layers).

(3) The present invention has the following advantages.

(a) In the light emitting device according to the first aspect of the present invention, the upper surface of the transparent substrate constituting the light emitting device has a shape containing a portion inclined with respect to the upper surface of the stack of GaN-based compound semiconductor layers. Therefore, light emitted from the stack of GaN-based compound semiconductor layers and reflected at the upper surface and side surfaces of the transparent substrate can efficiently go out of the light emitting element. In addition, since the transparent substrate has no horizontal overhang over the upper surface of the stack of GaN-based compound semiconductor layers, it is possible to increase the utilization efficiency of light emitted from the stack of GaN-based compound semiconductor layers, and reduce the size of the light emitting device in the horizontal directions thereof. For example, when a plurality of LEDs are arranged in an array on a circuit board, it is possible to conserve space in the horizontal directions.

(b) In the light emitting device according to the second aspect of the present invention, the optical member which has a light-exit surface containing a portion inclined with respect to the upper surface of the stack of GaN-based compound semiconductor layers is arranged in contact with the upper surface of the transparent substrate. Therefore, light emitted from the stack of GaN-based compound semiconductor layers and reflected at the light-exit surface of the optical element and the side surfaces of the optical element and/or the transparent substrate can efficiently go out of the light emitting element. In addition, since the optical element and the transparent substrate have no horizontal overhang over the upper surface of the stack of GaN-based compound semiconductor layers, it is possible to increase the utilization efficiency of light emitted from the stack of GaN-based compound semiconductor layers, and reduce the size of the light emitting device in the horizontal directions thereof. For example, when a plurality of LEDs are arranged in an array on a circuit board, it is possible to conserve space in the horizontal directions, as in the first aspect of the present invention.

(c) When the optical element in the second aspect of the present invention has a function of a sealing package for (hermetically) sealing the light emitting element, it is possible to prevent degradation and coloring of a sealant caused by heat generation in the light emitting element and irradiation with light having relatively short wavelengths emitted from the stack of GaN-based compound semiconductor layers, although such degradation occurs when the sealants are used in the conventional light emitting devices. Therefore, when the above optical element has the function of a sealing package, the light transmittance does not decrease, and therefore the decrease in the emission efficiency in the light emitting element can be prevented.

(d) When the process for producing a light emitting device according to the third aspect of the present invention is used, the light emitting device according to the first aspect of the present invention can be easily produced through the aforementioned steps (a) to (c).

BRIEF DESCRIPTION OF THE DRAWINGS

FIG. 13 is a perspective view of a construction in which a plurality of light emitting devices are arranged in an array.

FIGS. 14A and 14B are schematic cross-sectional views of light emitting devices in each of which an optical element having a function of a sealing package for hermetically sealing a light emitting element is bonded so as to cover a light emitting element.

FIG. 16 is a flow chart indicating steps in the production process according to the third aspect of the present invention.

DESCRIPTION OF PREFERRED EMBODIMENTS

Embodiments of the present invention are explained in detail below with reference to the attached drawings.

First Embodiment

Before the explanation of the first embodiment of the present invention, the critical angle and reflection of light will be explained.

Figure 1A:
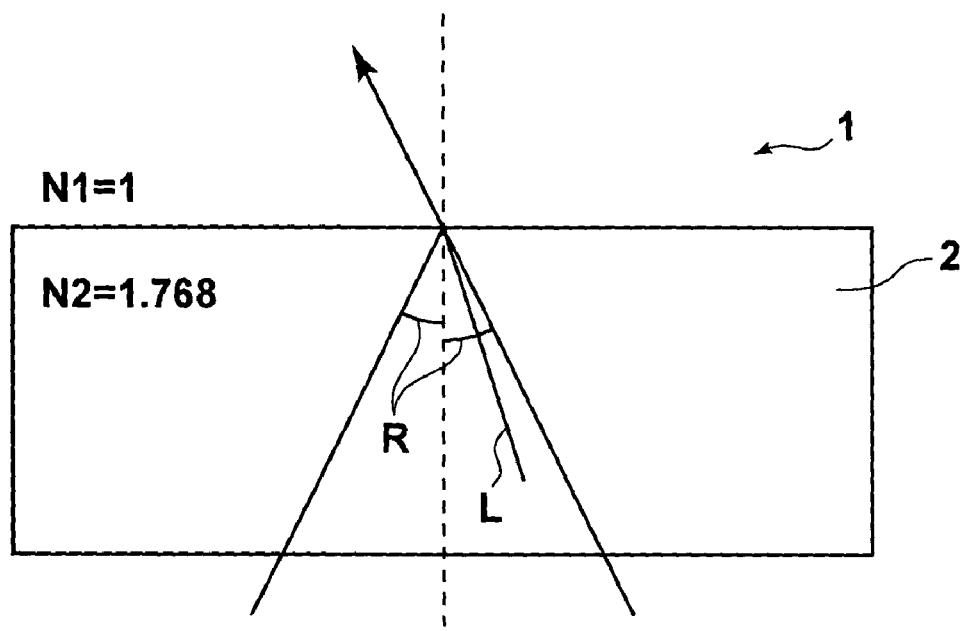
FIGS. 1A and 1B are diagrams for explaining the critical angle and reflection of light.
Figure 1B:
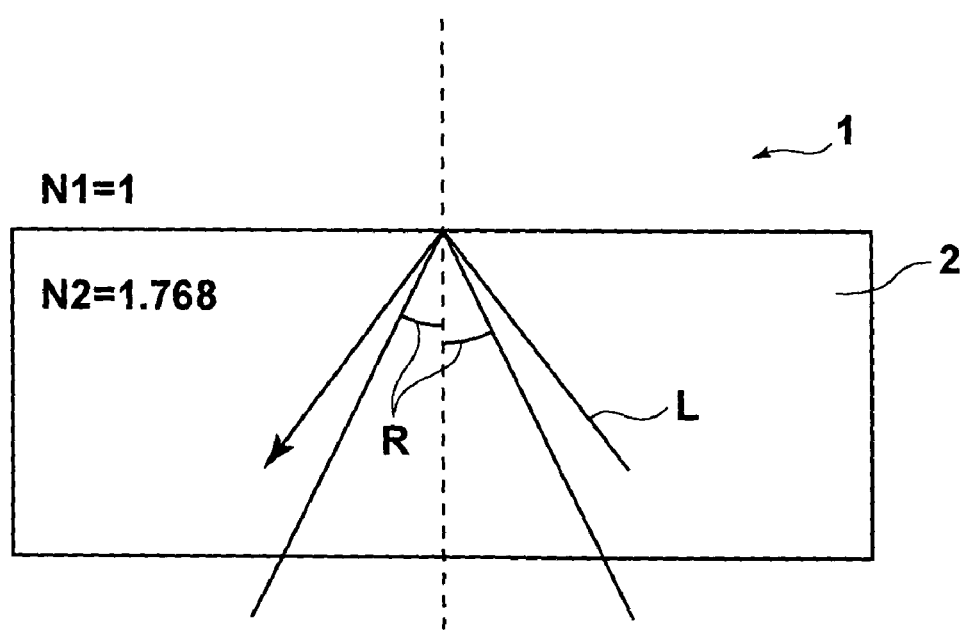

FIGS. 1A and 1B are diagrams for explaining the critical angle and reflection of light. In FIGS. 1A and 1B, it is assumed that a piece of sapphire glass 2 is placed in a space filled with air 1. The optical refractive index N1 of the air 1 is one (i.e., N1=1), and the optical refractive index N2 of the sapphire glass 2 is 1.768 (i.e., N2=1.768) At a boundary surface between mediums having different optical refractive indexes, a critical angle R is determined based on the refractive indexes. When light L is incident on the boundary surface at an incident angle not greater than the critical angle R, the light L passes through the boundary surface as illustrated in FIG. 1A. When light L is incident on the boundary surface at an incident angle greater than the critical angle R, the light L is totally reflected at the boundary surface as illustrated in FIG. 1B. It is known that the critical angle R for total reflection of the light incident from the sapphire glass 2 on the boundary surface between the sapphire glass 2 and the air 1 is 35 degrees (i.e., R=35°).

Figure 2:
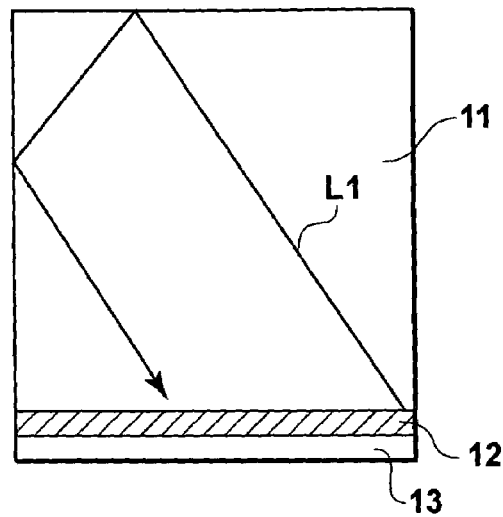
FIG. 2 is a schematic cross-sectional view of a typical light emitting device having a cubic shape.

FIG. 2 is a schematic view of a typical light emitting device having a cubic shape. The light emitting device illustrated in FIG. 2 comprises a light emitting element and an electrode 13, where the light emitting element is constituted by a sapphire substrate 11 (as a transparent substrate) and a stack of GaN-based compound semiconductor layers 12. When a predetermined amount of current flows through the electrode 13 and the stack of GaN-based compound semiconductor layers 12, light L1 is emitted from the upper surface of the stack of GaN-based compound semiconductor layers 12. The total reflection also occurs within the light emitting device of FIG. 2. That is, when the light L1 is incident on the upper surface of the sapphire substrate 11 at an incident angle not greater than the critical angle R, the light L1 passes through the upper surface of the sapphire substrate 11. When the light L1 is incident on the upper surface of the sapphire substrate 11 at an incident angle greater than the critical angle R, the light L1 is totally reflected at the upper surface of the sapphire substrate 11. The major portion of the light totally reflected at the upper surface of the sapphire substrate 11 is further reflected at the side surfaces, and returned to the stack of GaN-based compound semiconductor layers 12, which is the emission region. Since the emission region has a property of absorbing light having the same wavelength as the emitted light, the above light returned to the emission region is absorbed by the emission region, and cannot go out of the light emitting device of FIG. 2.

Figure 3A:
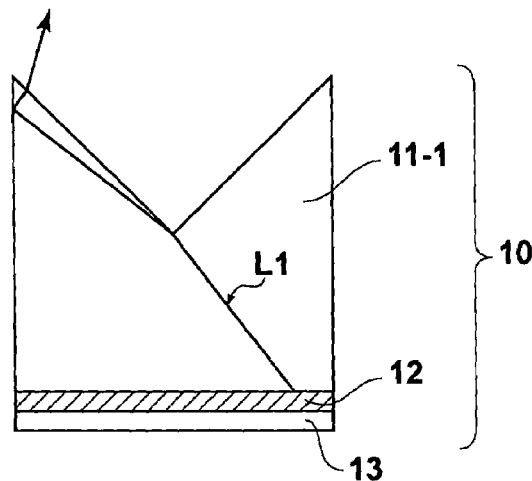
FIGS. 3A and 3B are schematic cross-sectional views of a light emitting device as a first embodiment of the present invention.
Figure 3B:
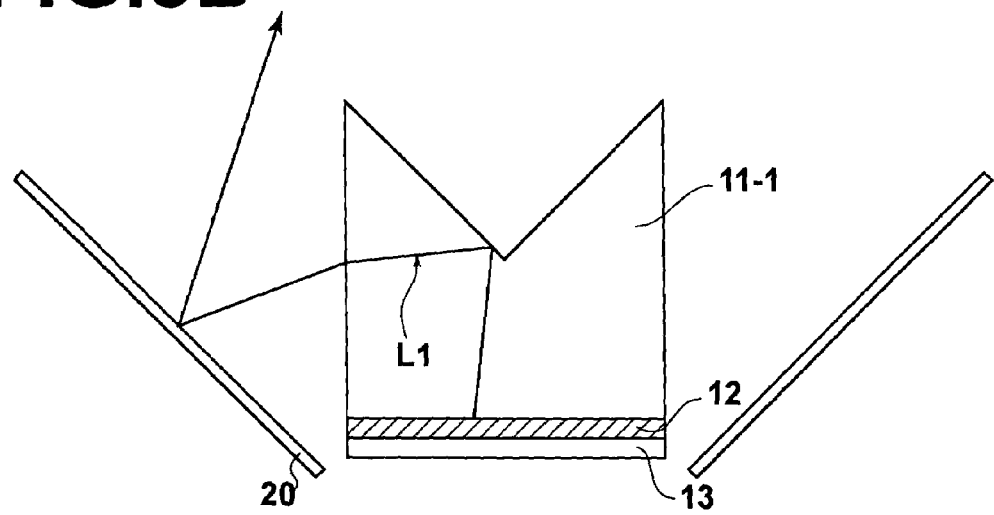
Figure 4:
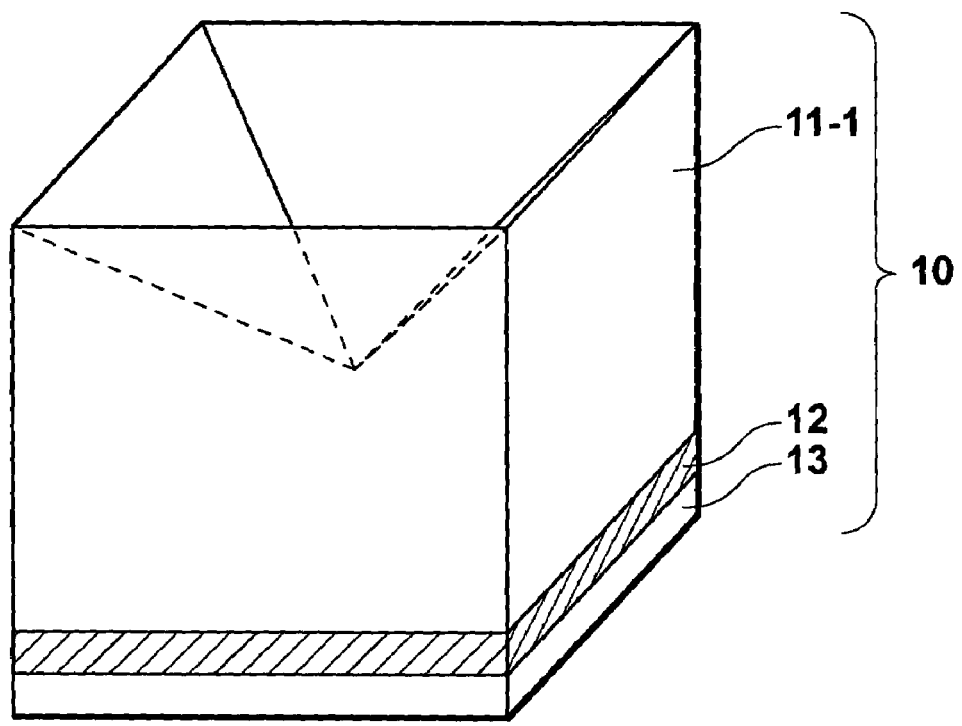
FIG. 4 is a perspective view of the light emitting device according to a first embodiment of the present invention.

FIGS. 3A and 3B are schematic cross-sectional views of a light emitting device as the first embodiment of the first aspect of the present invention, and FIG. 4 is a perspective view of the light emitting device. In the light emitting device 10 illustrated in FIGS. 3A and 3B, the upper surface of the sapphire substrate 11-1 contains a portion which is inclined with respect to the upper surface of the stack of GaN-based compound semiconductor layers 12. In the first embodiment, the upper surface of the sapphire substrate 11-1 is a quadrangular pyramidal concave surface. In FIGS. 3A and 3B, a lead frame or a printed circuit board is not shown.

In the light emitting device 10, when light L1 emitted from the stack of GaN-based compound semiconductor layers 12 is incident on the upper surface of the sapphire substrate 11-1 at an incident angle exceeding the critical angle R, the light L1 is reflected at the upper surface of the sapphire substrate 11-1, and is then incident on a side surface of the sapphire substrate 11-1. When the light L1 reflected at the upper surface of the sapphire substrate 11-1 is incident on the side surface at an incident angle exceeding the critical angle R, the light L1 is reflected again at the side surface of the sapphire substrate 11-1 as illustrated in FIG. 3A, and is again incident on the upper surface of the sapphire substrate 11-1.

Due to the inclinations of the upper surface of the sapphire substrate 11-1, the probability that the incident angle at which light is incident on the upper surface of the sapphire substrate 11-1 is not greater than the critical angle R is high. That is, the probability that the light incident on the upper surface of the sapphire substrate 11-1 passes through the upper surface of the sapphire substrate 11-1 and goes out of the light emitting device is increased by the inclinations of the upper surface of the sapphire substrate 11-1.

On the other hand, when light L1 emitted from the stack of GaN-based compound semiconductor layers 12 is incident on the side surface of the sapphire substrate 11-1 at an incident angle not greater than the critical angle R, the light L1 passes through the side surface of the sapphire substrate 11-1 and goes out of the light emitting device as illustrated in FIG. 3B.

As explained above, when the upper surface of the sapphire substrate 11-1 has a shape containing a portion inclined with respect to the upper surface of the stack of GaN-based compound semiconductor layers 12, the light L1 emitted from the stack of GaN-based compound semiconductor layers 12 can efficiently go out. In addition, since the light emitting device has no horizontal overhang, space can be conserved while enhancing the utilization efficiency of the emitted light L1.

Further, when reflection plates 20 inclined with respect to the side surfaces of the sapphire substrate 11-1 are arranged as illustrated in FIG. 3B, it is possible to reflect to a desired direction the light which passes through the side surfaces of the sapphire substrate 11-1.

A relationship between the inclination and the height of the upper surface of the sapphire substrate will be explained below.

Figure 5A:
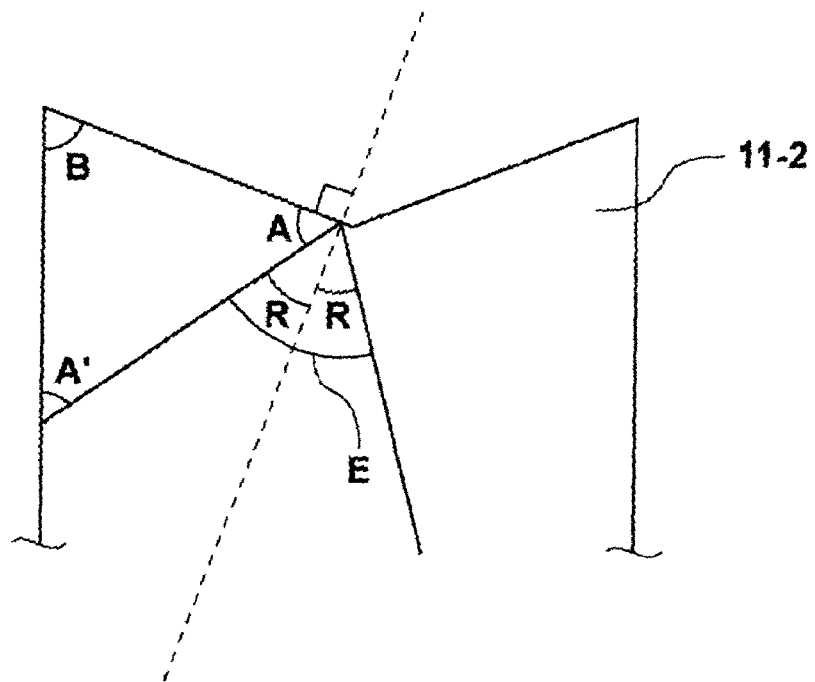
FIGS. 5A and 5B are schematic cross-sectional views of an example of a sapphire substrate having a conically recessed upper surface.

FIG. 5A is a vertical cross-sectional view of an example of a sapphire substrate 11-2 having a conically recessed upper surface. Since the cross section of the sapphire substrate 11-2 is bilaterally symmetrical, only a case where light is incident on a portion of the conically recessed upper surface indicated as the left half of the cross section of the conically recessed upper surface in FIG. 5A is illustrated. In FIG. 5A, the angle E is twice the critical angle R (E=2R), and bisected by an incident normal to the conically recessed upper surface. In addition, the angle A is defined as an angle formed with the conically recessed upper surface and the line which is inclined from the incident normal toward the conically recessed upper surface by the critical angle R (i.e., A=90°−R), the angle B is defined as an angle formed with the conically recessed upper surface and the side surface of the sapphire substrate 11-2, and the angle A' is defined as an angle formed with the side surface of the sapphire substrate 11-2 and the line which is inclined from the incident normal toward the conically recessed upper surface by the critical angle R.

Figure 5B:
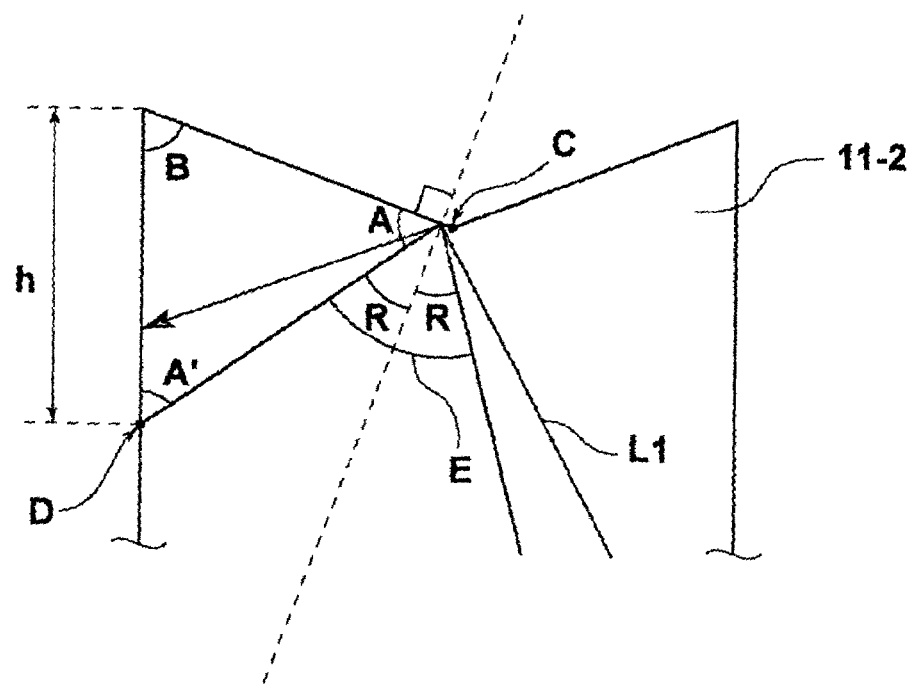

When the light L1 emitted from the stack of GaN-based compound semiconductor layers 12 is incident on the conically recessed upper surface at an incident angle within the range determined by the angle E (i.e., when the incident angle is not greater than the critical angle R), the light L1 passes through the conically recessed upper surface and goes out of the light emitting device. On the other hand, when the light L1 emitted from the stack of GaN-based compound semiconductor layers 12 is incident on the conically recessed upper surface at an incident angle out of the range determined by the angle E, the light L1 is totally reflected at the conically recessed upper surface, and directed to the side surface of the sapphire substrate 11-2. At this time, when the angle A is equal to the angle A', the light L1 directed to the side surface of the sapphire substrate 11-2 is incident on the side surface at an incident angle not greater than the critical angle R, and therefore passes through the side surface (i.e., goes out of the light emitting device). Thus, it is preferable to determine the angle B so that the angle A' is equal to or greater than the angle A. In addition, it is also preferable that the sapphire substrate 11-2 has such a height that the point D illustrated in FIG. 5B is contained in the sapphire substrate 11-2, where a line which contains the vertex C of the conically recessed upper surface and is parallel to the aforementioned line inclined from the incident normal toward the conically recessed upper surface by the critical angle R meets the side surface of the sapphire substrate 11-2 at the point D. In this case, all of the light L1 reflected at the conically recessed upper surface and directed to the side surface of the sapphire substrate 11-2 can pass through the side surface and go out of the light emitting device.

Figure 6A:
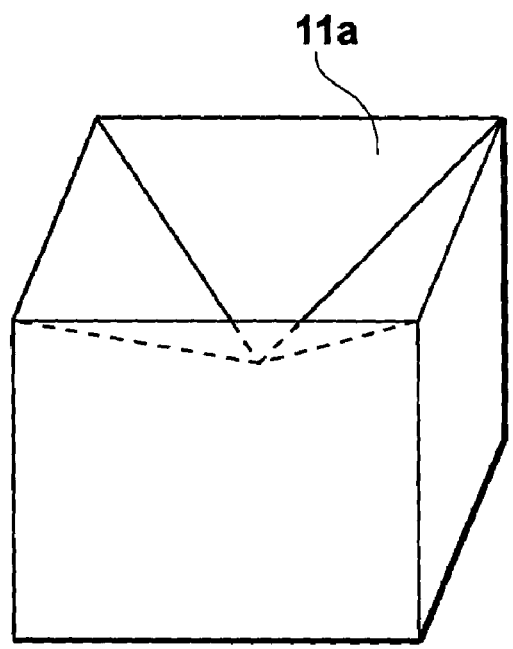
FIGS. 6A and 6B are perspective views of examples of sapphire substrates each having an upper surface which contains a quadrangular pyramidal surface.
Figure 6B:
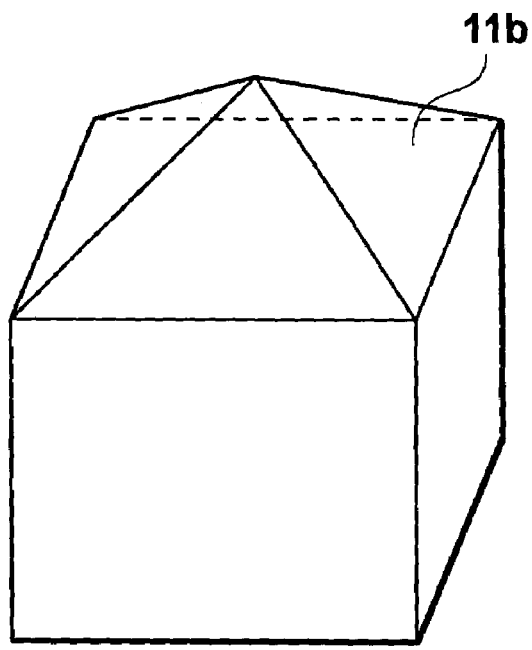

The upper surface of the sapphire substrate in the first embodiment may have various shapes. The following are examples of the possible shapes of the upper surface of the sapphire substrate:

(1) Shapes containing quadrangular pyramidal concave or convex surfaces as illustrated by reference numbers 11a and 11b in FIGS. 6A and 6B, respectively.

Figure 7A:
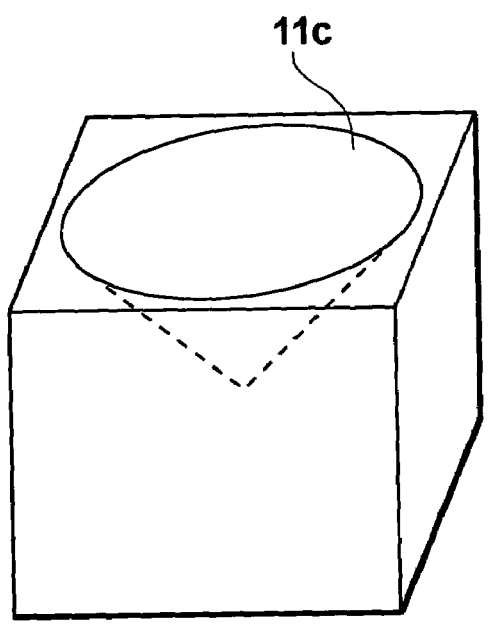
FIGS. 7A and 7B are perspective views of examples of sapphire substrates each having an upper surface which contains a conical surface.
Figure 7B:
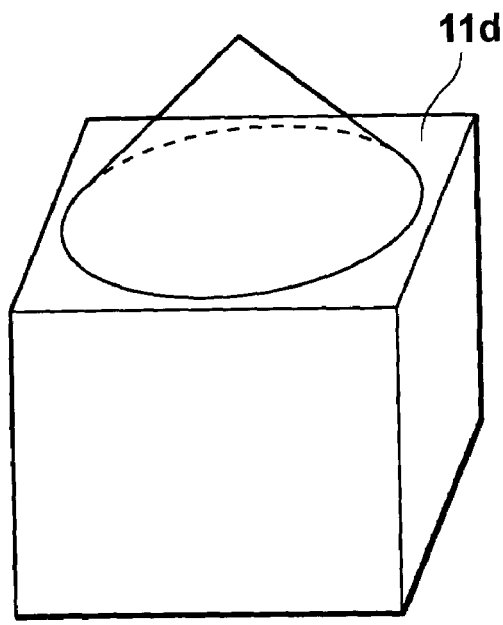

(2) Shapes containing conical concave or convex surfaces as illustrated by reference numbers 11c and 11d in FIGS. 7A and 7B, respectively.

Figure 8A:
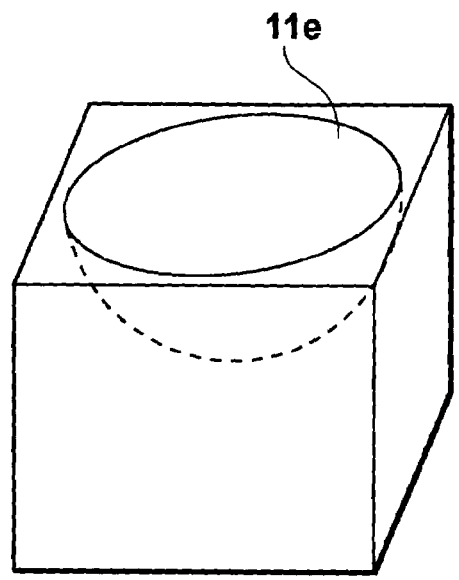
FIGS. 8A and 8B are perspective views of examples of sapphire substrates each having an upper surface which contains a hemispherical surface.
Figure 8B:
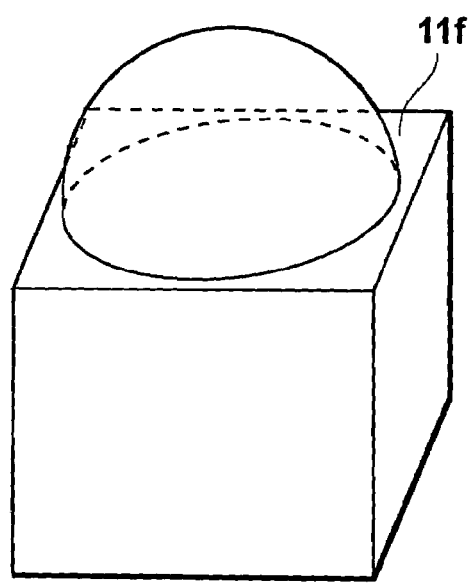

(3) Shapes containing hemispherical concave or convex surfaces as illustrated by reference numbers 11e and 11f in FIGS. 8A and 8B, respectively.

Figure 9A:
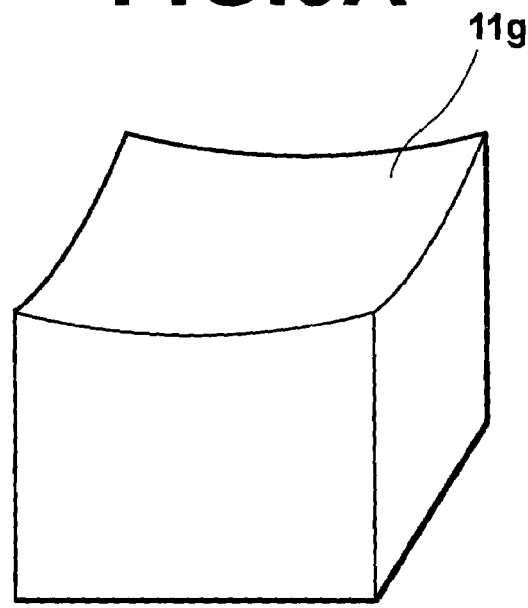
FIGS. 9A and 9B are perspective views of examples of sapphire substrates each having an upper surface which contains a paraboloidal surface.
Figure 9B:
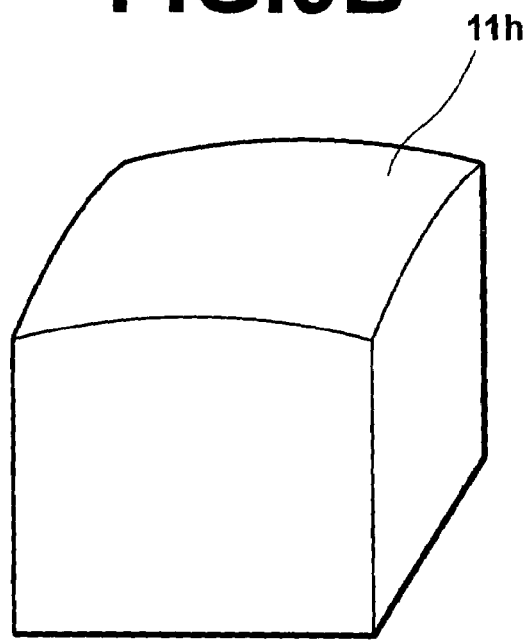

(4) Shapes containing paraboloidal concave or convex surfaces as illustrated by reference numbers 11g and 11h in FIGS. 9A and 9B, respectively.

Figure 10A:
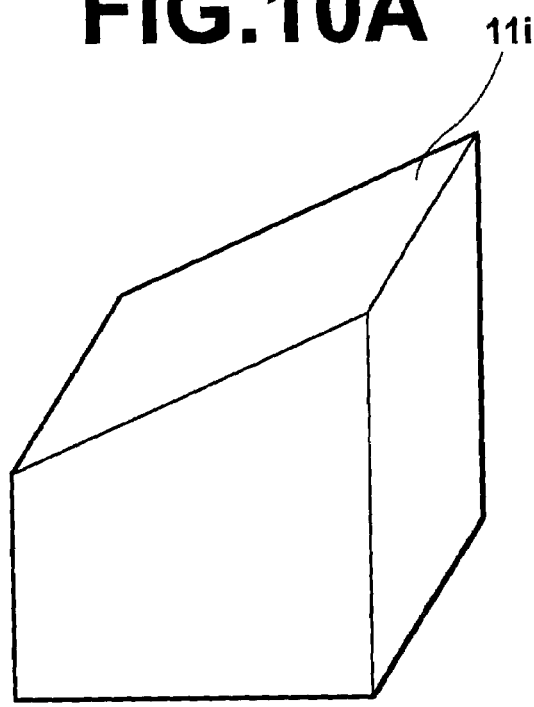
FIGS. 10A and 10B are perspective views of examples of sapphire substrates each having an upper surface which contains one or more planes inclined with respect to an upper surface of a stack of semiconductor layers.
Figure 10B:
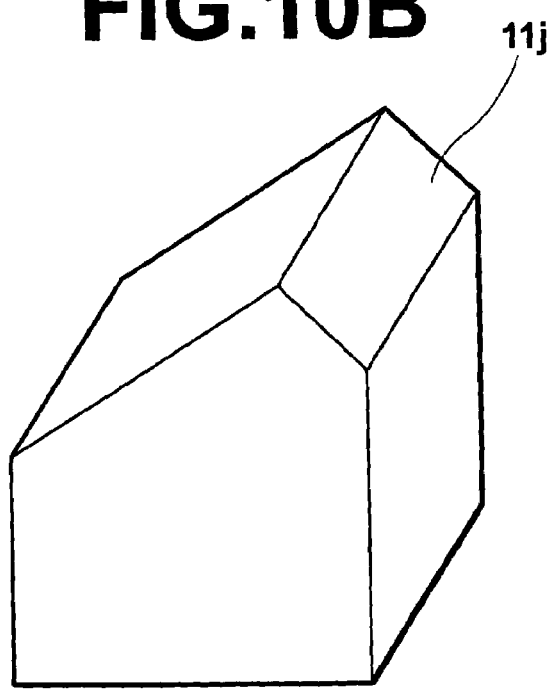

(5) Shapes each containing one or more planes inclined with respect to the stack of GaN-based compound semiconductor layers 12 as illustrated by reference numbers 11i and 11j in FIGS. 10A and 10B, respectively.

Second Embodiment

The second embodiment of the present invention will be explained below.

Figure 11:
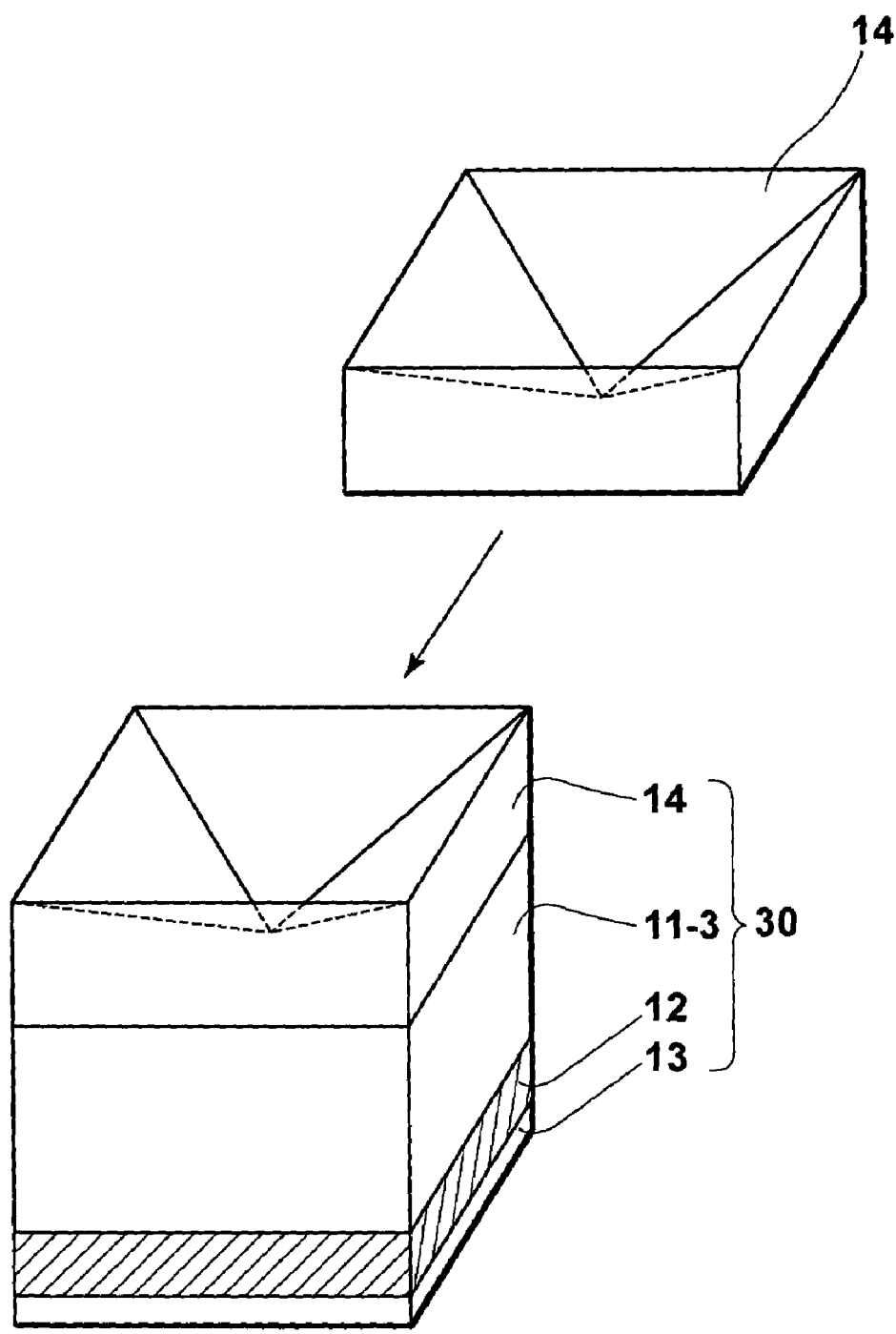
FIG. 11 is a perspective view of a light emitting device according to a second embodiment of the present invention.

FIG. 11 is a schematic perspective view of a light emitting device as the second embodiment of the second aspect of the present invention.

In the light emitting device 10 according to the first embodiment illustrated in FIGS. 3A and 3B, the upper surface of the sapphire substrate 11-1 per se has a shape containing a portion inclined with respect to the upper surface of the stack of GaN-based compound semiconductor layers 12. On the other hand, in the light emitting device 30 as the second embodiment illustrated in FIG. 11, an optical element 14 is arranged in contact with the upper surface of the sapphire substrate 11-3, and the upper surface (light-exit surface) of the optical element 14 has a quadrangular pyramidal concave shape as the aforementioned shape containing a surface inclined with respect to the upper surface of the stack of GaN-based compound semiconductor layers 12. The optical element 14 may be made of glass, plastic, or the like which is easy to process. However, it is preferable that the material of the optical element 14 has a refractive index that approximates the refractive index of the sapphire substrate 11-3. Since the light emitting device 30 has the above construction, the light emitting device 30 has a similar advantage as the light emitting device 10 as the first embodiment, and the light L1 emitted from the stack of GaN-based compound semiconductor layers 12 can efficiently go out of the light emitting device 30. In addition, since the light emitting device 30 has no horizontal overhang, space can be conserved while enhancing the utilization efficiency of the emitted light L1. Further, since the optical element 14 can be made of glass, plastic, or the like which is easy to process, it is unnecessary to process the sapphire substrate per se, which is relatively hard and difficult to process, and therefore the production efficiency can be increased.

The upper surface (light-exit surface) of the optical element 14 may have various shapes. The following are examples of the possible shapes of the upper surface of the optical element 14, although the shape of the upper surface of the optical element 14 is not limited to the following examples.

Figure 12A:
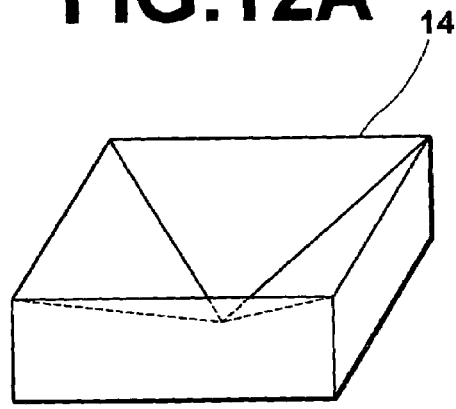
FIGS. 12A to 12F are perspective views of optical elements each having an upper surface containing a portion inclined with respect to an upper surface of a stack of semiconductor layers.

(1) Shapes containing a quadrangular pyramidal surface as illustrated by reference number 14*a* in FIG. 12A.

Figure 12B:
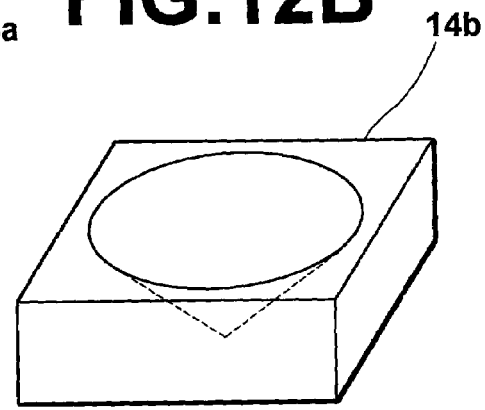

(2) Shapes containing a conical pyramidal surface as illustrated by reference number 14*b* in FIG. 12B.

Figure 12C:
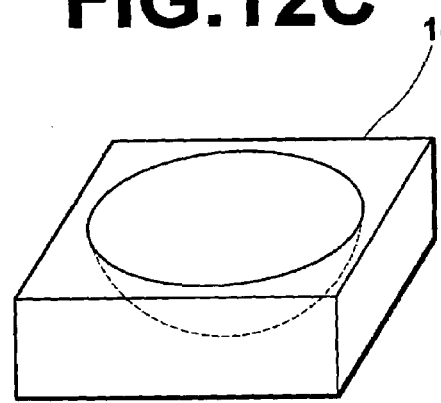

(3) Shapes containing a hemispherical surface as illustrated by reference number 14*c* in FIG. 12C.

Figure 12D:
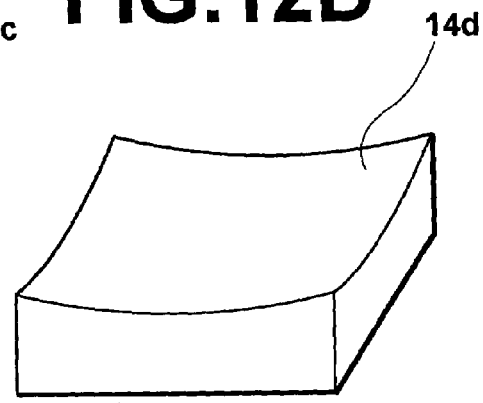

(4) Shapes containing a paraboloidal surface as illustrated by reference number 14*d* in FIG. 12D.

Figure 12E:
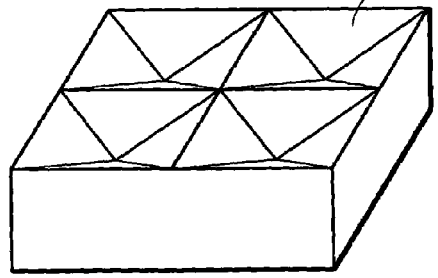

(5) Shapes containing a plurality of quadrangular pyramidal concave surfaces as illustrated by reference number 14*e* in FIG. 12E.

Figure 12F:
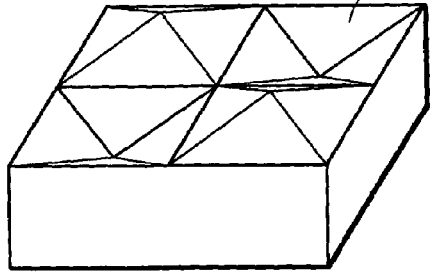

(6) Shapes containing concave and convex quadrangular pyramidal surfaces as illustrated by reference number 14*f* in FIG. 12F.

There is a preferable relationship between the inclination of the upper surface (light-exit surface) of the optical element 14 and the height of the optical element 14, which is similar to the preferable relationship between the inclination of the upper surface and the height of the sapphire substrate 11-2 in the first embodiment.

In addition, it is possible to arrange the optical element 14 so as to have a function of a sealing package which hermetically seals the light emitting element.

The light emitting element is hermetically sealed and protected from the external environment in order to secure the reliability of the light emitting element in a light emitting device and the like against the external environment. However, the epoxy sealants widely used for sealing are degraded and colored by heat generation in the light emitting element. Therefore, the light transmittance decreases, and the emission efficiency is lowered, for example, as indicated in "Introduction to Nitride Semiconductor Blue Laser and Light Emitting Diodes," edited by Shuji Nakamura and Shigefusa Chichibu, pp. 289–292. In particular, in LED's which emit light having short wavelengths of 360 to 400 nm and are used for M (magenta) fixture of an image thermally recorded in a thermal color-forming layer in each color thermal recording sheet, the light having the short wavelengths is absorbed by the epoxy sealant, and accelerates the degradation of the epoxy sealant as well as the heat generated in the light emitting element.

The lowering of the emission efficiency due to the degradation of the sealant can be prevented by the following measures.

(1) The entire light emitting element is covered with the optical element 14.

(2) The optical element 14 is bonded so that epoxy does not exist in regions through which the emitted light passes, or the thickness of an adhesive layer (including a portion through which the emitted light passes) in contact with the light emitting element is minimized.

Examples of the above measures which are taken at the time of flip-chip mounting are shown in FIGS. 14A and 14B. FIG. 14A is a schematic cross-sectional view of a light emitting device in which an optical element is bonded with an adhesive so that the optical element serves as a sealing package, and FIG. 14B is a schematic cross-sectional view of a light emitting device in which the gap between the chip and the optical element is filled with an adhesive.

The light emitting devices illustrated in FIGS. 14A and 14B each have a construction in which a light emitting element is mounted on a substrate (the substrate may be a portion of a printed circuit board), and an optical element 15*a* is arranged in contact with the upper surface of the substrate so that the optical element covers and hermetically seals the light emitting element. In the substrate, an insulation layer 22 is formed on aluminum 23, and a conductive pattern containing a positive-power-supply line 21*a* and a negative-power-supply line 21*b* is formed on the insulation layer 22. In addition, a portion of the substrate around an area on which the light emitting element is to be mounted is shaped to form at least one mirror. The light emitting element includes the sapphire substrate 11-4 and a stack of GaN-based compound semiconductor layers 12 formed on the sapphire substrate 11-4.

When the light emitting element is mounted on the substrate, a positive electrode 13*a* and a negative electrode 13*b* are respectively bonded to the positive-power-supply line 21*a* and the negative-power-supply line 21*b* with a conductive adhesive 51. The optical element 15*a*, which is formed to have such a shape as to cover the light emitting element, is arranged to cover the light emitting element so that the upper inner surface of the optical element 15*a* is in contact with the upper surface of the sapphire substrate 11-4. In addition, the bottom edge of the optical element 15*a* is bonded to the subsrtate with a sealing adhesive 52 so that the light emitting element is hermetically sealed.

As mentioned before, the sealants in the conventional light emitting devices are degraded by heat generated by the light emitting element or transmission of light being emitted from the stack of GaN-based compound semiconductor layers and having relatively short wavelengths. However, since the light emitting devices of FIGS. 14A and 14B are formed as above, the light transmittance does not decrease even when the sealant in each of the light emitting devices of FIGS. 14A and 14B is degraded and colored as the sealants in the conventional light emitting devices. Thus, it is possible to prevent the lowering of emission efficiency.

Figure 15A:
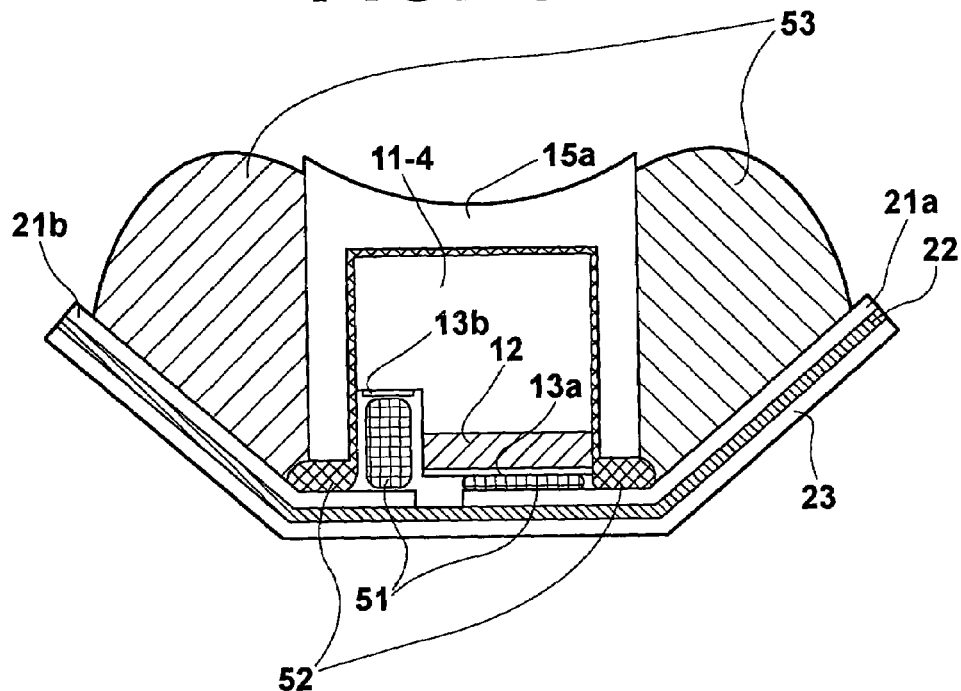
FIGS. 15A and 15B are schematic cross-sectional views of light emitting devices in each of which a resin structure having a curved surface is formed around an optical element.
Figure 15B:
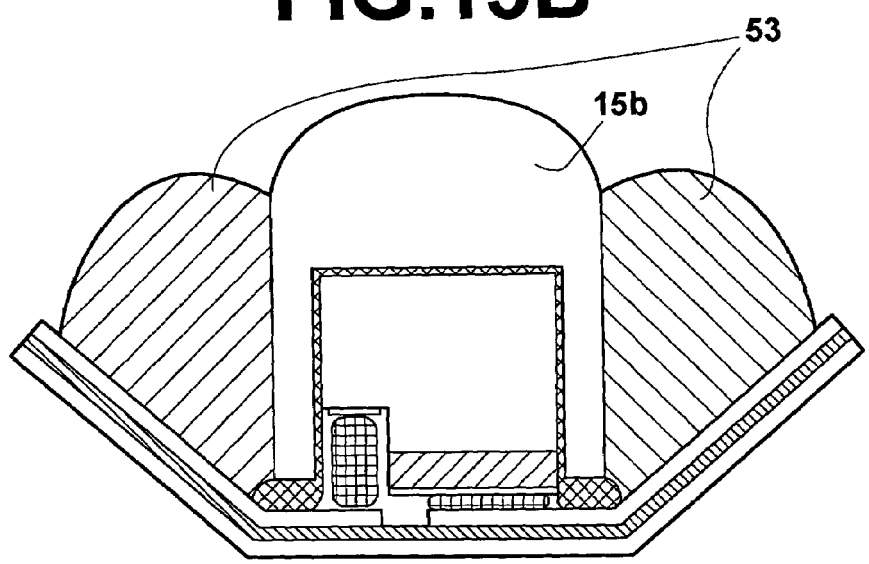

In addition, it is possible to fill the space around the optical element 15*a* with a resin 53 such as acrylic, silicon, or epoxy resin so that the exposed surface of the resin 53 is curved as illustrated in FIGS. 15A and 15B. In this case, the amount of light reflected inward is decreased by the curved surface, and the efficiency in light output from the light emitting device can be further increased. After light passes through glass and spreads, the optical power density decreases. Therefore, it is possible to suppress degradation of the resin when the resin has a property of being degraded in proportion to optical power density.

When the resin 53 is made of a silicon-based adhesive or the XLV-series acrylic adhesive (which is available from Kyoritsu Chemical & Co., Ltd.), the durability against ultraviolet (UV) light is increased, and therefore the degradation of the resin can be greatly suppressed.

Further, since the efficiency in light output from the light emitting device according to the first and second embodiments is increased without providing a horizontal overhang, it is possible to conserve space in horizontal directions. Furthermore, in a case where a plurality of light emitting devices are arranged in an array on a printed circuit board, the arrangements in the first and second embodiments are particularly effective. An example of such a case is illustrated in FIG. 13, where a plurality of light emitting devices 10' each of which is identical to the light emitting device 10 as the first embodiment are arranged in an array on a printed circuit board 40, and a plurality of reflection plates 20' are arranged at the positions corresponding to the plurality of light emitting devices 10' on the printed circuit board 40.

Production Process

Next, a process for producing the light emitting device according to the first embodiment of the present invention is explained below.

FIG. 16 is a flow chart indicating production steps in the production process according to the third aspect of the present invention.

First, a sapphire substrate is preprocessed in step S1. Then, in step S2, a buffer layer made of aluminum nitride (AlN), a layer made of n-type Si-doped gallium nitride (GaN), and a multiple-quantum-well layer are formed by metal organic chemical vapor deposition (MOCVD), where the multiple-quantum-well layer is realized by repeatedly forming a GaN quantum-well barrier sublayer doped with appropriate amounts of Si and Mg and a light emission sublayer made of indium gallium nitride (InGaN). Subsequently, a p-type Mg-doped GaN layer is grown. Thus, the semiconductor layers constituting an LED wafer are formed in step S2.

Next, processing for activating the p-type carriers is performed in step S3, and photolithography, etching, and evaporation are repeated for formation of a p-side electrode and an n-side electrode in steps S4 to S6. Thus, formation of the LED wafer is completed.

Thereafter, in step S7, a resist is applied to the exposed surface of the sapphire substrate, and a resist pattern representing grayscale information is produced by using a laser exposure system or the like. Then, in step S8, the exposed surface of the sapphire substrate is formed to have a desired shape, by dry etching such as reactive ion etching or reactive ion-beam etching. Finally, borders between chips are scribed by diamond scribing in step S9, and cleaved with a breaking system so as to divide the LED wafer into separate chips of light emitting elements in step S10.

When each light emitting element produced as above is mounted on a lead frame or a printed circuit board, a light emitting device is completed. The printed circuit board is produced by forming an insulation layer and a pattern of copper, nickel, and/or gold in this order on a metal plate, a cladding member, a ceramic plate, or the like, where the metal plate is made of thermally conductive copper, aluminum, light ferroalloy, Kovar, or a copper-based alloy (e.g., Ambiloy, a trade name of Mitsubishi Materials Corporation), the cladding member is constituted by a copper core covered with a metal of molybdenum, tantalum, titanium, tungsten, or the like, and the ceramic plate is made of alumina, aluminum nitride, c-BN (cubic boron nitride), or the like. When the light emitting element is mounted on the printed circuit board, the light emitting element can be bonded to the printed circuit board with solder cream or the like.

When the above process is used, a light emitting element according to the first aspect of the present invention can be easily produced.

In addition, all of the contents of the Japanese patent application No. 2002-287296 are incorporated into this specification by reference.

What is claimed is:

1. A light emitting device comprising:
a light emitting element which includes a transparent substrate and a stack of GaN-based compound semiconductor layers formed on a first surface of the transparent substrate; and
one of a lead frame and a printed circuit board on which said light emitting element is mounted so that said transparent substrate is located on a side of said stack of GaN-based compound semiconductor layers opposite to the one of the lead frame and the printed circuit board;
wherein a second surface of the transparent substrate opposite to said first surface consists of at least one of a quadrangular pyramidal surface, an inverted quadrangular pyramidal surface, a conical surface, an inverted conical surface, a hemispherical surface, an inverted hemispherical surface, a paraboloidal surface, an inverted paraboloidal surface, an obliquely truncated surface having no surface parallel to the first surface, an inverted obliquely truncated surface having no surface parallel to the first surface, a multifaceted obliquely truncated surface having no surface parallel to the first surface, and an inverted multifaceted obliquely truncated surface having no surface parallel to the first surface.

2. A light emitting device comprising:
a light emitting element which includes a transparent substrate and a stack of GaN-based compound semiconductor layers formed on a first surface of the transparent substrate;
an optical member which is arranged in contact with a second surface of the transparent substrate opposite to said first surface, wherein said optical member consists of at least one of a quadrangular pyramidal surface, an inverted quadrangular pyramidal surface, a conical surface, an inverted conical surface, a hemispherical surface, an inverted hemispherical surface, a paraboloidal surface, an inverted paraboloidal surface, an obliquely truncated surface having no surface parallel to the first surface, an inverted obliquely truncated surface having no surface parallel to the first surface, a multifaceted obliquely truncated surface having no surface parallel to the first surface, and an inverted multifaceted obliquely truncated surface having no surface parallel to the first surface; and
one of a lead frame and a printed circuit board on which said light emitting element is mounted so that the transparent substrate is located on a side of the stack of GaN-based compound semiconductor layers opposite to the one of the lead frame and the printed circuit board.

3. A light emitting device according to claim 2, wherein said optical member has a function of a sealing package which seals said light emitting element.

4. A light emitting device comprising:
one of a lead frame and a printed circuit board; and
a light emitting element, the light emitting element comprising:
a transparent substrate having a first surface and a second surface opposite to the first surface, and a stack of GaN-based compound semiconductor layers formed on the first surface of the transparent substrate, wherein the stack of GaN-based semiconductor layers are mounted on the lead frame or circuit board;

wherein the second surface of the transparent substrate comprises a quadrangular pyramidal surface or an inverted quadrangular pyramidal surface.

5. A light emitting device comprising:
one of a lead frame and a printed circuit board; and
a light emitting element, the light emitting element comprising:
   a transparent substrate having a first surface and a second surface opposite to the first surface, and
   a stack of GaN-based compound semiconductor layers formed on the first surface of the transparent substrate, wherein the stack of GaN-based semiconductor layers are mounted on the lead frame or circuit board;

wherein the second surface of the transparent substrate comprises a conical surface or an inverted conical surface.

6. A light emitting device comprising:
one of a lead frame and a printed circuit board; and
a light emitting element, the light emitting element comprising:
   a transparent substrate having a first surface and a second surface opposite to the first surface, and
   a stack of GaN-based compound semiconductor layers formed on the first surface of the transparent substrate, wherein the stack of GaN-based semiconductor layers are mounted on the lead frame or circuit board;

wherein the second surface of the transparent substrate comprises a hemispherical surface or an inverted hemispherical surface.

7. A light emitting device comprising:
one of a lead frame and a printed circuit board; and
a light emitting element, the light emitting element comprising:
   a transparent substrate having a first surface and a second surface opposite to the first surface, and
   a stack of GaN-based compound semiconductor layers formed on the first surface of the transparent substrate, wherein the stack of GaN-based semiconductor layers are mounted on the lead frame or circuit board;

wherein the second surface of the transparent substrate comprises a paraboloidal surface or an inverted paraboloidal surface.

8. A light emitting device comprising:
one of a lead frame and a printed circuit board; and
a light emitting element, the light emitting element comprising:
   a transparent substrate having a first surface and a second surface opposite to the first surface, and
   a stack of GaN-based compound semiconductor layers formed on the first surface of the transparent substrate, wherein the stack of GaN-based semiconductor layers are mounted on the lead frame or circuit board;

wherein the second surface of the transparent substrate consists of at least one of an obliquely truncated surface, an inverted obliquely truncated surface, a multifaceted obliquely truncated surface, and an inverted multifaceted obliquely truncated surface, and wherein the second surface does not include any surface parallel to the first surface.

9. A light emitting device comprising:
one of a lead frame and a printed circuit board;
a light emitting element comprising:
   a transparent substrate having a first surface and a second surface opposite to the first surface and
   a stack of GaN-based compound semiconductor layers formed on the first surface of the transparent substrate, wherein the stack of GaN-based semiconductor layers are mounted on the lead frame or circuit board; and
an optical member arranged in contact with the second surface of the transparent substrate, wherein said optical member comprises a quadrangular pyramidal surface or an inverted quadrangular pyramidal surface.

10. A light emitting device comprising:
one of a lead frame and a printed circuit board;
a light emitting element comprising:
   a transparent substrate having a first surface and a second surface opposite to the first surface and
   a stack of GaN-based compound semiconductor layers formed on the first surface of the transparent substrate, wherein the stack of GaN-based semiconductor layers are mounted on the lead frame or circuit board; and
an optical member arranged in contact with the second surface of the transparent substrate, wherein said optical member comprises a conical surface or an inverted conical surface.

11. A light emitting device comprising:
one of a lead frame and a printed circuit board;
a light emitting element comprising:
   a transparent substrate having a first surface and a second surface opposite to the first surface and
   a stack of GaN-based compound semiconductor layers formed on the first surface of the transparent substrate, wherein the stack of GaN-based semiconductor layers are mounted on the lead frame or circuit board; and
an optical member arranged in contact with the second surface of the transparent substrate, wherein said optical member comprises a hemispherical surface or an inverted hemispherical surface.

12. A light emitting device comprising:
one of a lead frame and a printed circuit board;
a light emitting element comprising:
   a transparent substrate having a first surface and a second surface opposite to the first surface and
   a stack of GaN-based compound semiconductor layers formed on the first surface of the transparent substrate, wherein the stack of GaN-based semiconductor layers are mounted on the lead frame or circuit board; and
an optical member arranged in contact with the second surface of the transparent substrate, wherein said optical member comprises a paraboloidal surface or an inverted paraboloidal surface.

13. A light emitting device comprising:
one of a lead frame and a printed circuit board;
a light emitting element comprising:
   a transparent substrate having a first surface and a second surface opposite to the first surface and
   a stack of GaN-based compound semiconductor layers formed on the first surface of the transparent substrate, wherein the stack of GaN-based semiconductor layers are mounted on the lead frame or circuit board; and an optical member having a first surface arranged in contact with the second surface of the transparent substrate, and a second surface opposite to the first surface, wherein the second surface of said optical member consists of at least one of an obliquely truncated surface, an inverted obliquely truncated surface, a multifaceted obliquely truncated surface, and an inverted multifaceted obliquely truncated surface, and wherein the second surface of the optical member does not include any surface parallel to the first surface of the transparent substrate.

14. A light emitting device, comprising:

one of a lead frame and a printed circuit board; and a light emitting element comprising:

a transparent substrate having a first surface and a second surface opposite to the first surface and a stack of GaN-based compound semiconductor layers formed on the first surface of the transparent substrate, wherein the stack of GaN-based semiconductor layers are mounted on the lead frame or circuit board;

wherein the second surface of the transparent substrate consists of one or more of a plurality of quadrangular pyramids, a plurality of inverted quadrangular pyramids, a plurality of conical shapes, a plurality of inverted conical shapes, a plurality of hemispherical shapes, a plurality of inverted hemispherical shapes, a plurality of paraboloidal shapes, a plurality of inverted paraboloidal shapes, a plurality of obliquely truncated shapes, a plurality of inverted obliquely truncated shapes, a plurality of multifaceted obliquely truncated shapes, and a plurality of inverted multifaceted obliquely truncated shapes.

15. A light emitting device, comprising:

one of a lead frame and a printed circuit board;

a light emitting element comprising:

a transparent substrate having a first surface and a second surface opposite to the first surface and a stack of GaN-based compound semiconductor layers formed on the first surface of the transparent substrate, wherein the stack of GaN-based semiconductor layers are mounted on the lead frame or circuit board; and an optical member arranged in contact with the second surface of the transparent substrate, wherein said optical member consists of one or more of a plurality of quadrangular pyramids, a plurality of inverted quadrangular pyramids, a plurality of conical shapes, a plurality of inverted conical shapes, a plurality of hemispherical shapes, a plurality of inverted hemispherical shapes, a plurality of paraboloidal shapes, a plurality of inverted paraboloidal shapes, a plurality of obliquely truncated shapes, a plurality of inverted obliquely truncated shapes, a plurality of multifaceted obliquely truncated shapes, and a plurality of inverted multifaceted obliquely truncated shapes.

16. A light emitting device, comprising:

one of a lead frame and a printed circuit board; and a light emitting element comprising:

a transparent substrate having a first surface and a second surface opposite to the first surface and a stack of GaN-based compound semiconductor layers formed on the first surface of the transparent substrate, wherein the stack of GaN-based semiconductor layers are mounted on the lead frame or circuit board;

wherein the second surface of the transparent substrate has no surface parallel to the first surface.

17. A light emitting device, comprising:

one of a lead frame and a printed circuit board;

a light emitting element comprising:

a transparent substrate having a first surface and a second surface opposite to the first surface and a stack of GaN-based compound semiconductor layers formed on the first surface of the transparent substrate, wherein the stack of GaN-based semiconductor layers are mounted on the lead frame or circuit board; and an optical member having a first surface arranged in contact with the second surface of the transparent substrate, and a second surface, opposite to the first surface, wherein the second surface of said optical member has no surface parallel to the first surface of the transparent substrate.

* * * * *